(12) United States Patent
Yoon

(10) Patent No.: US 9,178,378 B2
(45) Date of Patent: Nov. 3, 2015

(54) MULTI WIRELESS CHARGING APPARATUS AND METHOD FOR MANUFACTURING THE SAME

(75) Inventor: Young Seok Yoon, Chungcheongnam-do (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 448 days.

(21) Appl. No.: 13/610,647

(22) Filed: Sep. 11, 2012

(65) Prior Publication Data

US 2013/0099730 A1    Apr. 25, 2013

(30) Foreign Application Priority Data

Oct. 25, 2011    (KR) .................. 10-2011-0109544

(51) Int. Cl.
 *H02J 7/00* (2006.01)
 *H02J 7/02* (2006.01)
 *H05K 1/16* (2006.01)
 *H02J 17/00* (2006.01)
 *H05K 3/46* (2006.01)

(52) U.S. Cl.
 CPC ............... *H02J 7/025* (2013.01); *H02J 17/00* (2013.01); *H05K 1/165* (2013.01); *H05K 3/4691* (2013.01); *H05K 3/4611* (2013.01); *H05K 3/4697* (2013.01); *H05K 2201/0715* (2013.01); *H05K 2201/086* (2013.01); *Y10T 29/49155* (2015.01)

(58) Field of Classification Search
 CPC .......... H02J 7/0042; H02J 7/00; H02J 7/025; H05K 1/165; H05K 3/4691; H05K 3/4611; H05K 3/4697; H05K 2201/086; H05K 2201/0715; Y10T 29/49155
 See application file for complete search history.

(56) References Cited

U.S. PATENT DOCUMENTS

| 7,388,756 | B1* | 6/2008 | Worl et al. ............... 361/760 |
| 7,952,322 | B2* | 5/2011 | Partovi et al. ............ 320/108 |
| 8,169,185 | B2* | 5/2012 | Partovi et al. ............ 320/108 |
| 8,395,353 | B2* | 3/2013 | Wang et al. .............. 320/108 |
| 8,552,593 | B2* | 10/2013 | Jung et al. ................ 307/104 |
| 8,631,567 | B2* | 1/2014 | Lee et al. .................. 29/846 |
| 8,819,920 | B2* | 9/2014 | Yoon et al. .............. 29/602.1 |
| 2007/0182367 | A1* | 8/2007 | Partovi .................... 320/108 |
| 2009/0096413 | A1* | 4/2009 | Partovi et al. ............ 320/108 |
| 2010/0133484 | A1* | 6/2010 | Heo et al. ................. 252/511 |
| 2010/0194206 | A1* | 8/2010 | Burdo et al. ............. 307/104 |
| 2011/0227527 | A1* | 9/2011 | Zhu et al. ................ 320/108 |
| 2011/0241615 | A1* | 10/2011 | Yeh ......................... 320/108 |
| 2012/0313569 | A1* | 12/2012 | Curran ..................... 320/101 |
| 2013/0082637 | A1* | 4/2013 | Eaton et al. .............. 320/101 |
| 2013/0127980 | A1* | 5/2013 | Haddick et al. ........... 348/14.08 |
| 2014/0253031 | A1* | 9/2014 | Duge ........................ 320/108 |

FOREIGN PATENT DOCUMENTS

KR    1020100094197    8/2010

* cited by examiner

*Primary Examiner* — Naum B Levin
(74) *Attorney, Agent, or Firm* — NSIP Law

(57) ABSTRACT

The multi wireless charging apparatus of the present invention includes a control unit generally controlling a wireless charging procedure; a plurality of wireless charging units electrically connected to the control unit; and folding units connecting between the wireless charging units, the folding units each having a void therein, which passes through both lateral surfaces thereof, and thereby to be folded up or down. Also, in the multi wireless charging apparatus of the present invention, each of the wireless charging units includes a shielding film made of a conductive material, such as conductive paste or ferrite, and formed on a lower surface thereof, for electromagnetic field shielding.

18 Claims, 7 Drawing Sheets

MULTI WIRELESS CHARGING APPARATUS AND METHOD FOR MANUFACTURING THE SAME

CROSS REFERENCE TO RELATED APPLICATION

This application claims the benefit of Korean Patent Application No. 10-2011-0109544, filed on Oct. 25, 2011, entitled "Multi Wireless Charging Apparatus and Method for Manufacturing the Same", which is hereby incorporated by reference in its entirety into this application.

BACKGROUND OF THE INVENTION

1. Technical Field

The present invention relates to a multi wireless charging apparatus and a method for manufacturing the same.

2. Description of the Related Art

In a wireless charging technology, power necessary for charging a battery is transmitted wirelessly without a power code or a connector for charging. This technology is applied only to limited uses, such as an electric toothbrush, a wireless telephone for home use, electric tools, and the like, in the prior art.

However, the use of the wireless charging technology is increasingly expanding, with a recent explosive increase of the smart phone markets. Smart phones allow users to enjoy various contents and multimedia freely at any time, but there is a limit to the usage time thereof due to limitation in battery capacity. The wireless charging technology in the smart phone market has largely changed since 2010, after a smart phone wirelessly charged appeared. In 2011, products mounting wireless charging modules for wirelessly charging a cellular phone and a smart phone are successively being reported domestically and internationally.

Since the wireless power consortium (WPC), which aims at broadening the use of non-contact type standards, reported the first standard features for devices with 5 W or lower in July, 2010, more and more manufactures are joining this consortium. The wireless charging technology, of which a market is expanding due to employment of the smart phone, is expected to be increasingly applied to high-power devices such as a digital camera, a tablet PC, a monitor, a digital TV, and the like, in the future.

Among several methods enabling wireless charging, an electromagnetic induction method is excellent in view of commercialization and practicality. The electromagnetic induction method, as disclosed in Korean Patent Laid-Open Publication No. 2010-0094197 (laid-open published on Aug. 26, 2010), uses the combination of electromagnetic energy generated from a coil wound several times.

This embodies products based on Faraday's rule that an electromagnetic field generated by a coil on which AC or high-frequency current flows induces electromotive force at an output terminal of an adjacent coil. When a general cellular phone, a smart phone, a digital camera, a tablet PC, a monitor, a notebook, or the like, on which a wireless charging receiving module is mounted, is placed on a charging surface of a wireless charger constituted of a wireless charging transmitting module, an analog circuit, a power circuit, a control circuit, a rectifying circuit, a charging circuit, and the like are run, and thereby charge a battery installed in a device.

However, this wireless charging apparatus is inconvenient to keep and carry out due to a large volume thereof, and it is difficult to wirelessly charge a plurality of devices at the same time.

SUMMARY OF THE INVENTION

The present invention has been made in an effort to provide a multi wireless charging apparatus allowing a folding type and having a slim thickness.

Also, the present invention has been made in an effort to provide a method for manufacturing the multi wireless charging apparatus.

According to one preferred embodiment of the present invention, there is provided a multi wireless charging apparatus, including: a control unit generally controlling a wireless charging procedure; a plurality of wireless charging units electrically connected to the control unit; and folding units connecting between the wireless charging units, the folding units each having a void therein, which passes through both lateral surfaces thereof, and thereby to be folded up or down.

The wireless charging unit may include a shielding film made of a conductive material and formed on a lower surface thereof, for electromagnetic field shielding.

The conductive material may be conductive paste or ferrite.

The folding units each may have the void between at least two double-sided FCCLs, and be folded up or down to allow the plurality of wireless charging units to be stacked in a joining type.

The wireless charging unit may include: at least one rigid base layer; and double-sided flexible copper clad laminates (FCCLs) bonded on an upper surface or a lower surface of the rigid base layer by using the rigid base layer therebetween, wherein the double-sided FCCLs each have a circuit layer formed on an upper surface or a lower surface thereof.

The rigid base layer may be formed by using a prepreg in which a glass fiber is impregnated with a thermosetting resin.

The circuit layer may include: a coil pattern consisting of closed loops; a first end disposed inside the coil pattern; a first electrode pattern spaced apart from the first end and disposed outside the closed loops of the coil pattern; and a wiring pattern electrically connecting the first end and the first electrode pattern through a first conductive via hole H1 and a second conductive via hole H2 passing through the double-sided FCCLs.

The wireless charging unit may further include a cover layer covering an uppermost surface or a lowermost surface of the double-sided FCCLs.

The cover layer may be an insulating layer made of a thermosetting material and bonded by using an adhesive.

The cover layer may be a solder resist coated and hardened layer.

According to one preferred embodiment of the present invention, there is provided a method for manufacturing a multi wireless charging apparatus, including: preparing at least two double-sided FCCLs having circuit patterns formed on an upper surface or a lower surface thereof; compressing the double-sided FCCLs by using rigid base layers therebetween, the rigid base layers being disposed in regions of a plurality of wireless charging units; forming a wiring pattern electrically connecting the circuit patterns through a first conductive via hole H1 and a second conductive via hole H2 passing through the compressed double-sided FCCLs and the rigid base layer, in a region of the wireless charging unit; forming cover layers covering external surfaces of the double-sided FCCLs; and mounting component devices on a region of a control unit electrically connected to the wireless charging units.

In the preparing of the double-sided FCCLs, the circuit patterns may include: coil patterns each consisting of closed loops; first ends disposed inside the coil patterns; and first electrode patterns spaced apart from the first ends and disposed outside the closed loops of the coil patterns.

In the forming of the wiring pattern, the wiring pattern may electrically connect the first ends and the first electrode patterns through the first conductive via hole H1 and the second conductive via hole H2.

The compressing of the double-sided FCCLs may include: forming the plurality of rigid base layers made of a prepreg in which a glass fiber is impregnated with a thermosetting resin; disposing the rigid base layers in the regions of the wireless charging units such that the rigid base layers are spaced apart from each other at a distance corresponding to a region of each folding unit; and heat-compressing the double-sided FCCLs by using the rigid base layers therebetween.

The forming of the cover layer may include: bonding an insulating layer made of a thermosetting material by using an adhesive on the external surfaces of the double-sided FCCLs; and providing shielding films made of a conductive material and formed on an external surface of the insulating layer, in the regions of the wireless charging units, for electromagnetic field shielding.

The forming of the cover layer may include: forming a solder resist layer by coating and hardening solder resist on the external surfaces of the double-sided FCCLs; and providing shielding films made of a conductive material and formed on an external surface of the solder resist layer, in the regions of the wireless charging units, for electromagnetic field shielding.

The conductive material may be conductive paste or ferrite.

DESCRIPTION OF THE PREFERRED EMBODIMENTS

Figure 1:
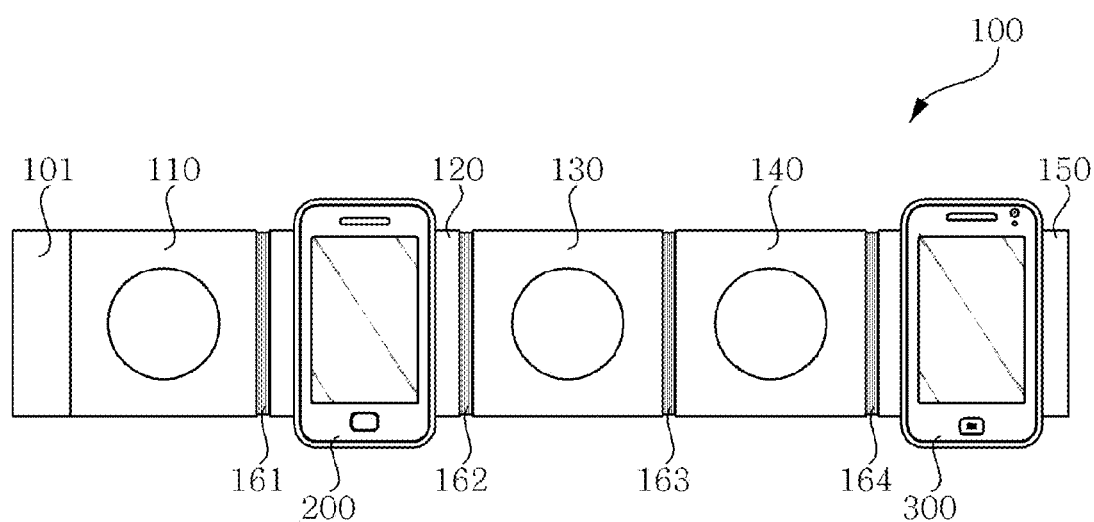
FIG. 1 is a top view of a multi wireless charging apparatus according to one preferred embodiment of the present invention.

Various objects, advantages and features of the invention will become apparent from the following description of preferred embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, terms used in the specification, 'first', 'second', etc., can be used to describe various components, but the components are not to be construed as being limited to the terms. The terms are only used to differentiate one component from other components. Further, when it is determined that the detailed description of the known art related to the present invention may obscure the gist of the present invention, the detailed description thereof will be omitted.

Figure 2:
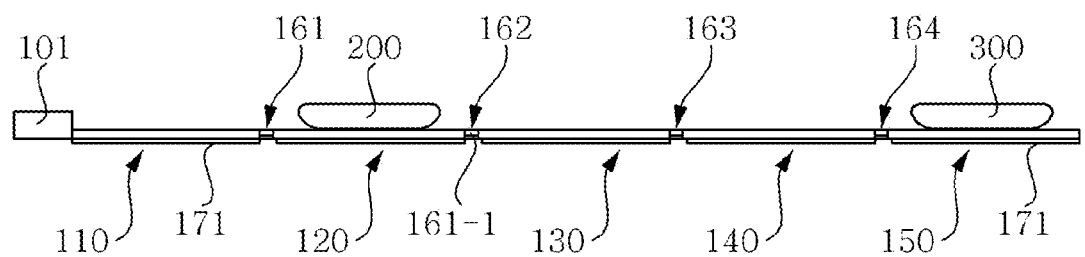
FIG. 2 is a side view of the multi wireless charging apparatus according to the preferred embodiment of the present invention.
Figure 3:
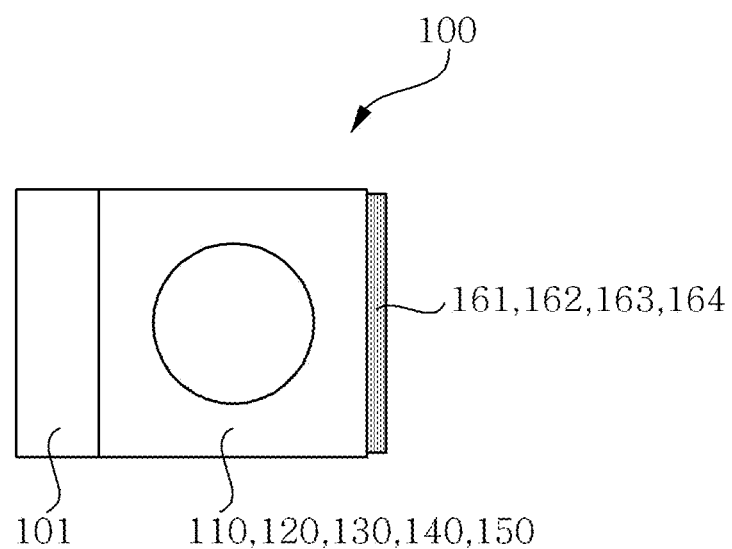
FIG. 3 is a top view of the multi wireless charging apparatus according to one preferred embodiment of the present invention, which is folded.

Hereinafter, preferred embodiments of the present invention will be described in detail with reference to the accompanying drawings. FIGS. 1 and 2 are a top view and a side view of a multi wireless charging apparatus according to one preferred embodiment of the present invention; FIG. 3 is a top view of the multi wireless charging apparatus according to one preferred embodiment of the present invention, which is folded; and FIGS. 4 to 8 are exemplary views respectively showing the use types of the multi wireless charging apparatus according to the preferred embodiment of the present invention.

A multi wireless charging apparatus 100 according to one preferred embodiment of the present invention, for example, as shown in FIGS. 1 and 2, includes a control unit 101 generally controlling a wireless charging procedure, a first wireless charging unit 110 electrically connected to the control unit 101, a second wireless charging unit 120 electrically connected to the control unit 101 and coupled with the first wireless charging unit 110 by a folding unit 161, a third wireless charging unit 130 electrically connected to the control unit 101 and coupled with the second wireless charging unit 120 by a folding unit 162, a fourth wireless charging unit 140 electrically connected to the control unit 101 and coupled with the third wireless charging unit 130 by a folding unit 163, and a fifth wireless charging unit 150 electrically connected to the control unit 101 and coupled with the fourth wireless charging unit 140 by a folding unit 164.

Also, the multi wireless charging apparatus 100 according to the present invention may further include a plurality of wireless charging units electrically connected to the control unit 101 and coupled by a folding unit.

This multi wireless charging apparatus 100 includes shielding films 171 for electromagnetic field shielding, which are respectively formed on lower surfaces of the first to fifth wireless charging units 110 to 150. Wireless charging receivers 200 and 300, such as a smart phone, a mobile telecommunication terminal, and the like, which are to be charged, stand on upper surfaces of the first to fifth wireless charging units 110 to 150, respectively.

Here, the first to fifth wireless charging units 110 to 150 overlap by folding the folding units 161 to 164, with the result that the multi wireless charging apparatus 100 may be transformed in a joining state where one wireless charging surface is exposed, as shown in FIG. 3.

More specifically, in the multi wireless charging apparatus 100, the first to fifth wireless charging units 110 to 150 coupled with each other by the folding units 161 to 164 have a slim thickness, and the folding units 161 to 164 are made of a material having good flexibility and have a flexible structure.

In particular, each of the folding units 161 to 164 has a void 161-1 therein, which passes through both lateral surfaces thereof, and thus, the folding units 161 to 164 can be easily folded up or down to provide a joining structure as shown in FIG. 3. That is, in the joining structure of the multi wireless charging apparatus 100 shown in FIG. 3, the folding units 161 to 164 are folded so that the first to fifth wireless charging units 110 to 150 are stacked, as shown in FIG. 4.

Figure 4:
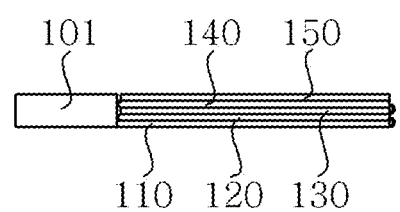
FIGS. 4 to 8 are exemplary views respectively showing the use types of the multi wireless charging apparatus according to the preferred embodiment of the present invention.
Figure 5:
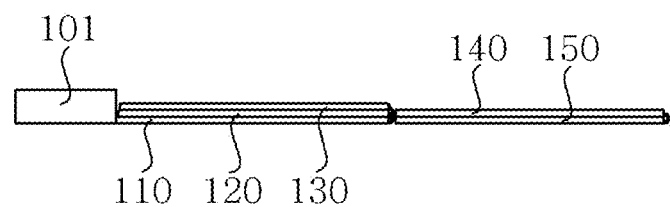
Figure 6:
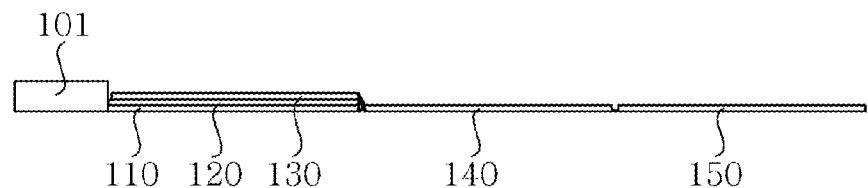
Figure 7:
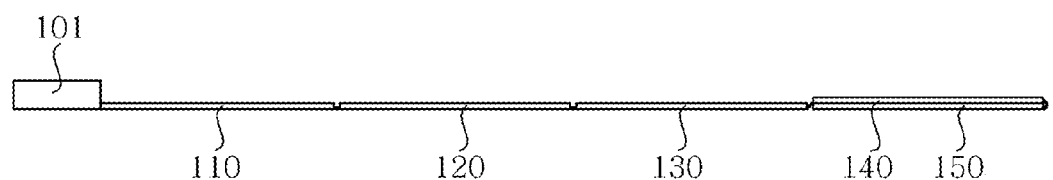
Figure 8:
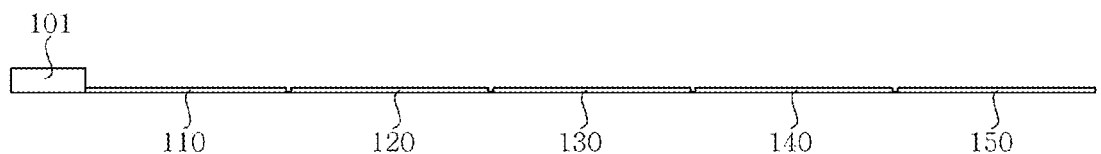

The multi wireless charging apparatus 100 in the joining state of FIG. 4 performs wireless charging with respect to one wireless charging receiver. However, the multi wireless charging apparatus 100 may be transformed such that two wireless charging surfaces are exposed by unfolding one folding unit 161, as shown in FIG. 5. Therefore, the respective folding units 161 to 164 are unfolded, and thus, the multi wireless charging apparatus may be transformed to expose three wireless charging surfaces as shown in FIG. 6, four wireless charging surfaces as shown in FIG. 7, or five wireless charging surfaces as shown in FIG. 8.

Also, the multi wireless charging apparatus 100 may further include a plurality of wireless charging units coupled to the fifth wireless charging unit 150 by a folding unit, thereby retaining five or more wireless charging surfaces.

Therefore, the multi wireless charging apparatus 100 according to the present preferred embodiment can be transformed or joined so as to expose the necessary number of wireless charging surfaces, by folding or unfolding the folding units 161 to 164 according to the number of wireless charging receivers needing wireless charging.

Further, the multi wireless charging apparatus 100 according to the present preferred embodiment can be easily carried about in the joining state as shown in FIG. 3, by folding all the folding units 161 to 164.

Figure 9:
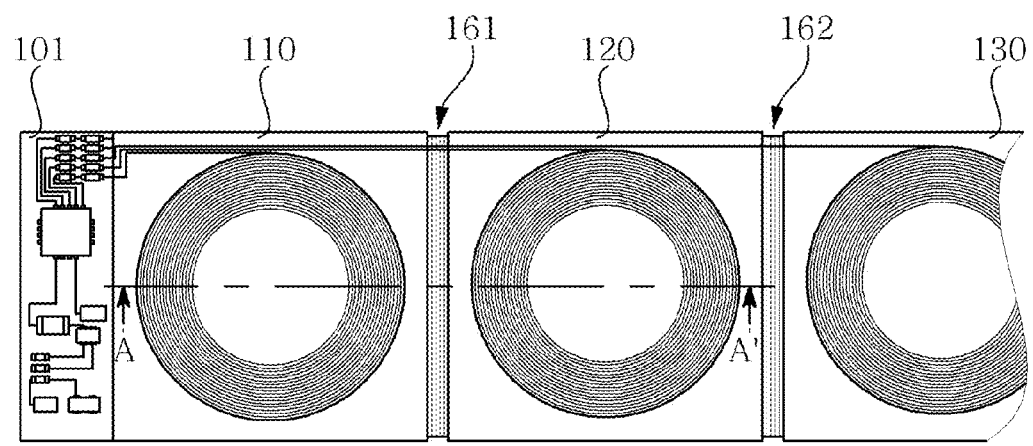
FIG. 9 is an upper perspective view of the multi wireless charging apparatus according to the preferred embodiment of the present invention.

Hereinafter, an inner structure of the multi wireless charging apparatus 100 according to the present preferred embodiment of the present invention will be described with reference to FIGS. 9 and 10. FIG. 9 is an upper perspective view of the multi wireless charging apparatus according to the preferred embodiment of the present invention, and FIG. 10 is a cross sectional view taken along the line A-A' of FIG. 9.

As for the inner structure of the multi wireless charging apparatus 100 according to the present preferred embodiment, as shown in FIG. 9, the control unit 101 includes a plurality of circuits and devices, and the first to fifth wireless charging units 110 to 150 include coil patterns respectively connected to and extended from drivers 103 provided in the control unit 101.

Figure 10:
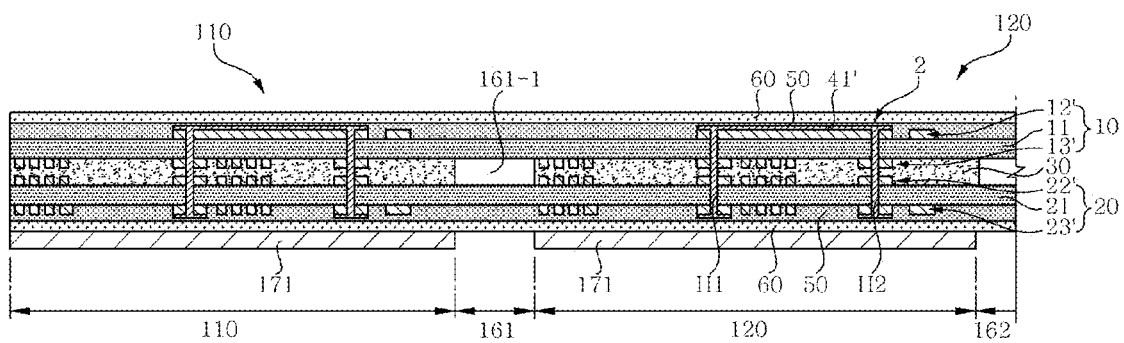
FIG. 10 is a cross sectional view taken along the line A-A' of FIG. 9.

As shown in FIG. 10, which is a cross sectional view taken along the line A-A' of FIG. 4A, the first to fifth wireless charging units 110 to 150 of the multi wireless charging apparatus 100 has the same inner structure. The folding units 161 to 164 each have the void 161-1, which is a separated space between the wireless charging units.

Specifically, each of the first to fifth wireless charging units 110 to 150 includes coil patterns 13-1, 22-1, and 23-1 each consisting of a plurality of continuous closed loops, which are formed on an upper surface or a lower surface of double-sided flexible copper clad laminates (FCCLs) 10 and 20 combined by each rigid base layer 30 therebetween; first ends 13-2, 22-2 and 23-2 disposed in an inner space between the coil patterns 13-1, 22-1, and 23-1; first electrode patterns 13-3, 22-3, and 23-3 spaced apart from the first ends 13-2, 22-2 and 23-2 such that they are disposed outside the closed loops of the coil patterns 13-1, 22-1, and 23-1; a wiring pattern 41' electrically connecting the first ends 13-2, 22-2 and 23-2 to each other and the first electrode patterns 13-3, 22-3 and 23-3 to each other by filling a first conductive via hole H1 and a second conductive via hole H2 with a conductive material; second insulating layers 60 provided on upper and lower surfaces by an adhesive 50, as cover layers for protecting the wiring pattern 41' and other metal patterns and preventing oxidation thereof; and a shielding film 171 provided on a lower surface of the lower second insulating layer 60.

The rigid base layer 30 is a prepreg in which a glass fiber is impregnated with a thermosetting resin, and has excellent strength and shear stress. Therefore, the rigid base layer 30 may be compressed between the double-sided flexible copper clad laminates (FCCLs) 10 and 20, thereby to serve as a durable member supporting each of the first to fifth wireless charging units 110 to 150. These rigid base layers 30 are provided in the region of the first to fifth wireless charging units 110 to 150, and thus, the separated space, such as the void 161-1, is formed between adjacent two of the rigid base layers 30.

This void 161-1 constitutes a region of the folding unit 161 between the double-sided FCCLs 10 and 20, and contributes to folding the folding units 161 between adjacent two of the first to fifth wireless charging units 110 to 150.

The first and second conductive via holes H1 and H2 passing through the double-sided FCCLs 10 and 20 are filled with a conductive metal, with the result the wiring pattern 41' is formed across the first conductive via hole (H1) and a second conductive via hole (H2). Therefore, the wiring pattern 41' can electrically connect the first ends 13-2, 22-2, and 23-2 and the first electrode patterns 13-3, 22-3, and 23-3, through the first conductive via hole H1 and the second conductive via hole H2.

The shielding film 171 is made of a conductive material, such as, conductive paste, ferrite, or the like, in order to shield the coil patterns 13-1, 22-1, and 23-1, the wiring pattern 41', and the like, from external magnetic field. In particular, the shielding film 171 may be formed on the lower surface of the lower second insulating layer 60 by using ferrite mixed with an adhesive at a region for each of the first to fifth wireless charging units 110 to 150.

Here, the multi wireless charging apparatus 100 according to the present preferred embodiment employs two double-sided FCCLs 10 and 20 as an example, but is not limited thereto. A plurality of double-sided FCCLs may be used so that a plurality of circuit layers are stacked.

As such, the multi wireless charging apparatus 100 constituted as above may be manufactured to have a slim thickness by using the rigid base layer 30 and the double-sided FCCLs 10 and 20, and the multi wireless charging apparatus 100 are folded by the folding units 161 to 164, and thus, the wireless charging units may be stacked in various types as shown in FIGS. 4 to 8. In particular, in a case where wireless charging is performed while the wireless charging unit are stacked as shown in FIG. 4, the multi wireless charging apparatus 100 form shielding between the stacked wireless charging units by the shielding film 171, thereby improving reliability in wireless charging.

Hereinafter, a method for manufacturing a multi wireless charging apparatus according to another preferred embodiment of the present invention will be described with reference to FIGS. 11 to 17. FIGS. 11 to 17 are cross sectional views for illustrating the process for manufacturing a multi wireless charging apparatus according to another preferred embodiment of the present invention, as taken along the line A-A' of FIG. 9.

Figure 11:
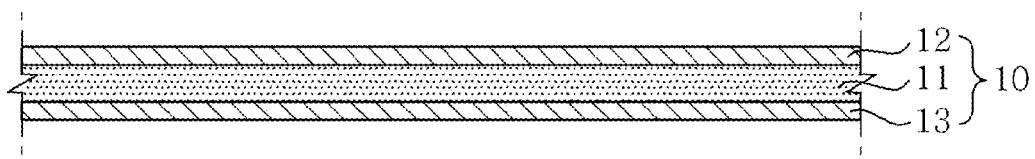
FIGS. 11 to 17 are cross sectional views for illustrating the process for manufacturing a multi wireless charging apparatus according to another preferred embodiment of the present invention.

As for the method for manufacturing the multi wireless charging apparatus 100 according to the present embodiment, first, double sided FCCLs 10 and 20 where first copper foils 12 and 22 are laminated on upper surfaces of first insulating layers 11 and 21 made of a thermosetting material such as polyimide, and second copper foils 13 and 23 are laminated on lower surfaces of the first insulating layers 11 and 21, as shown in FIG. 11, are prepared.

Figure 12:
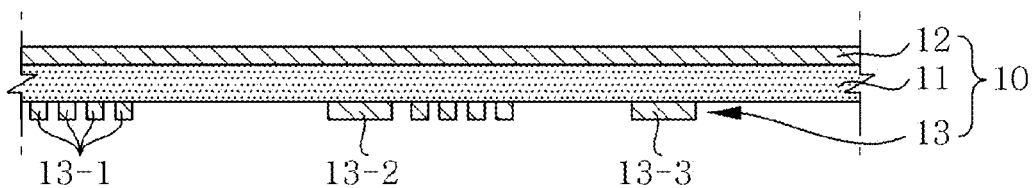

Then, as shown in FIG. 12, after preparing the double-sided FCCLs 10 and 20, any one or both of the first copper foils 12 and 22 and the second copper foils 13 and 23 of the double-sided FCCLs 10 and 20 are used to form a predetermined circuit layer for each of the first to fifth wireless charging units 110 to 150.

For example, the second copper foil 13 of the first double-sided FCCL 10 is used to form a first circuit layer 13' including a coil pattern 13-1 consisting of a plurality of continuous closed loops, a first end 13-2 and a first electrode pattern 13-3 of the coil pattern 13-1.

In the same manner, the first copper foil 22 of the second double-sided FCCL 20 is used to form a second circuit layer 22' corresponding to the first circuit layer 13'. The second circuit layer 22' includes a coil pattern 22-1 consisting of a plurality of continuous closed loops, a first end 22-2 and a first electrode pattern 22-3 of the coil pattern 22-1.

Further, the first and second circuit layers 13' and 22' further include second electrode patterns (not shown), which are integrated into second ends (not shown) of the coil patterns 13-1 and 22-1 as one body, respectively. Here, a third conductive via hole (not shown) for interlayer connection between the second electrode patterns (not shown) of the first and second circuit layers may be formed.

Figure 13:
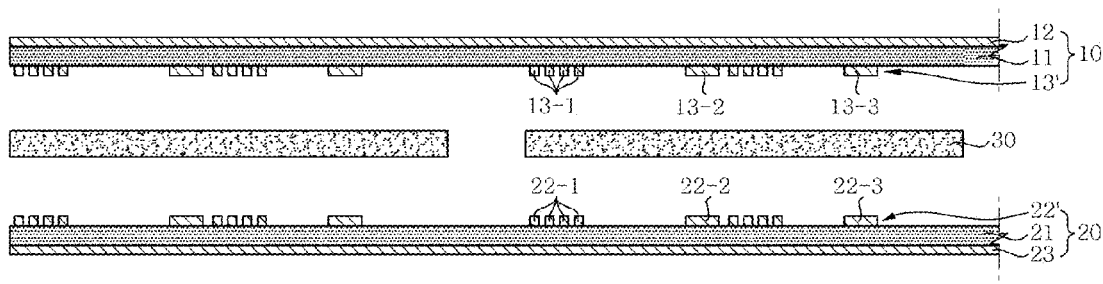

Then, as shown in FIG. 13, the first double-sided FCCL 10 and the second double-sided FCCL 20 are disposed such that the first circuit layer 13' faces the second circuit layer 22', and rigid base layers 30 are disposed in the regions of the first to fifth wireless charging units 110 to 150, between the first double-sided FCCL 10 and the second double-sided FCCL 20.

Figure 14:
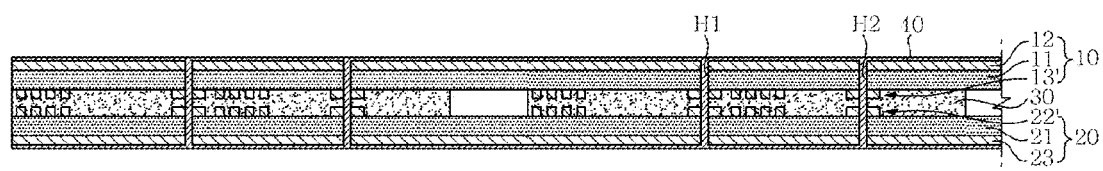

The disposed first double-sided FCCL 10 and the second double-sided FCCL 20 are heat-compressed by using the thus disposed rigid base layers 30, thereby forming a stacking structure as shown in FIG. 14.

As such, in a case where a plurality of double-sided FCCLs each having a circuit layer or circuit layers formed on one surface or both surfaces thereof are used, a coil pattern consisting of a plurality of closed loops can be easily formed. Further, the above heat compressing procedure enables the thickness of the entire part including the rigid base layer 30 to be slimmed.

Here, a first conductive via hole H1 for interlayer connection of the first ends 13-2 and 22-2 and a second conductive via hole H2 for interlayer connection of the first electrode patterns 13-3 and 22-3, which are formed in the circuit layers 13' and 22', are formed in the double-sided FCCLs 10 and 20. Here, the first or second conductive via hole H1 or H2 is a plated through hole (PTH), and formed by a mechanical drilling process such as computerized numerical control (CNC) drilling or the like.

When the first and second conductive via holes H1 and H2 formed by this drilling process are plated with a conductive metal, the first and second conductive via holes H1 and H2 become filled with the conductive metal and plating layers 40 covering external surfaces of the double-sided FCCLs 10 and 20 are formed, as shown in FIG. 14.

Figure 15:
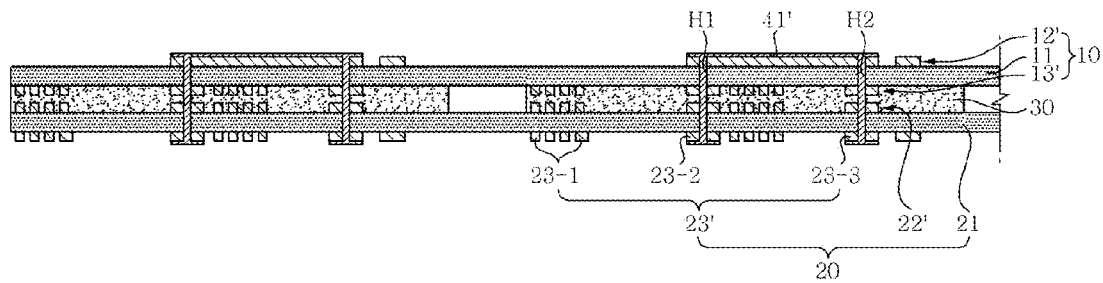

Then, the upper plating layer 40 and the outer copper foil 12 are etched, as shown in FIG. 15, thereby to form a wiring pattern 41' across from the first conductive via hole H1 to the second conductive via hole H2.

Here, the lower plating layer 40 and the lowermost copper foil 23 may be etched to form a third circuit layer 23' including a coil pattern 23-1, and a first end 23-2 and a first electrode pattern 23-3 of the coil pattern 23-1.

Therefore, the wiring pattern 41' can electrically connect the first ends 13-2, 22-2, and 23-2 and the first electrode patterns 13-3, 22-3, and 23-3.

Figure 16:
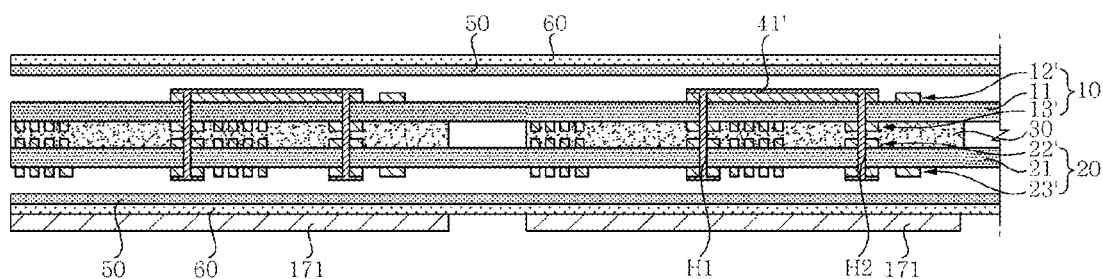

Then, in order to protect the exposed circuits including the wiring pattern 41' and prevent oxidation thereof, as shown in FIG. 16, a coverlay process is performed to form second insulating layers 60 on the exposed surface of the upper first insulating layer 11 and the exposed surface of the lower first insulating layer 21, including the wiring pattern 41', by using an adhesive 50 therebetween.

This coverlay process is performed in order to protect and insulate the uppermost exposed surface and the lowermost exposed surface of the etched double-sided FCCLs, and is applicable to fine circuits by uniformalizing heat-resistant adhesive strength, electric insulation, flame-retardant property, flex-resistant property, and adhesive flowability.

Specifically, the coverlay process may be performed by two manners, largely.

The first manner, as shown in FIG. 16, may be performed by compressing the second insulating layers 60 on the exposed surface of the upper first insulating layer 11 and the exposed surface of the lower first insulating layer 21, which include the wiring pattern 41', by using the adhesive 50 therebetween.

Here, as a material of the second insulating layers 60, a thermosetting resin such as polyimide may be used, like the upper first insulating layer 11 and the lower first insulating layer 21. This polyimide is excellent in heat resistant property because it can be used at a temperature up to 250° C., and properties thereof are less changed from a low temperature to a high temperature. Further, the polyimide has good impact-resistant property and good dimensional stability. Further, the polyimide is excellent in electric properties, friction-resistant property, and flame-retardant property.

The second manner may be performed by coating only solder resist (SR) on the exposed surface of the upper first insulating layer 11 including the wiring pattern 41' and the exposed surface of the lower first insulating layer 21, followed by hardening. Here, as the solder resist (SR), for example, photo resist may be used.

This solder resist (SR) is a kind of insulating permanent coating material, and may be formed in a film type covering the wiring pattern 41' so that undesired connection is prevented to occur due to soldering conducted during a subsequent procedure in which components of the control unit 101 are mounted.

This coverlay process may be performed by the compressing procedure while shielding films 171 are provided on the lower surface of the second lower insulating layer 60, or a procedure of forming the shielding films 171 may be separately performed.

Figure 17:
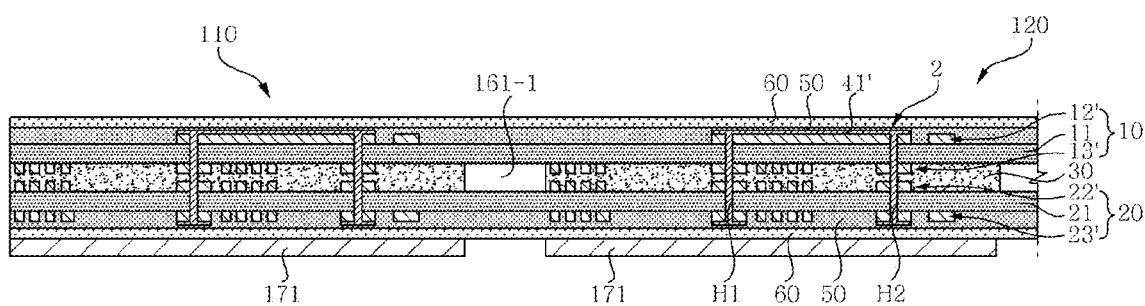

Therefore, as shown in FIG. 17, the shielding films 171 are formed on the lower surface of the lower second insulating layer 60, correspondingly to the rigid base layers 30 in the regions of the first to fifth wireless charging units 110 to 150.

The shielding film 171 may be formed by using a conductive material such as conductive paste, ferrite, or the like.

Then, devices (not shown) constituting the control unit 101, which is connected to the first wireless charging unit 110, are mounted on a region of the control unit 101.

As to the method for manufacturing the multi wireless charging apparatus according to the present preferred embodiment, a coil pattern stacking structure can be easily made, the entire thickness of the multi wireless charging apparatus 100 can be slimmed, and the folding units 161 to 164 including the inner voids 161-1 can be easily formed, by using the double-sided FCCLs 10 and 20.

Figure 18:
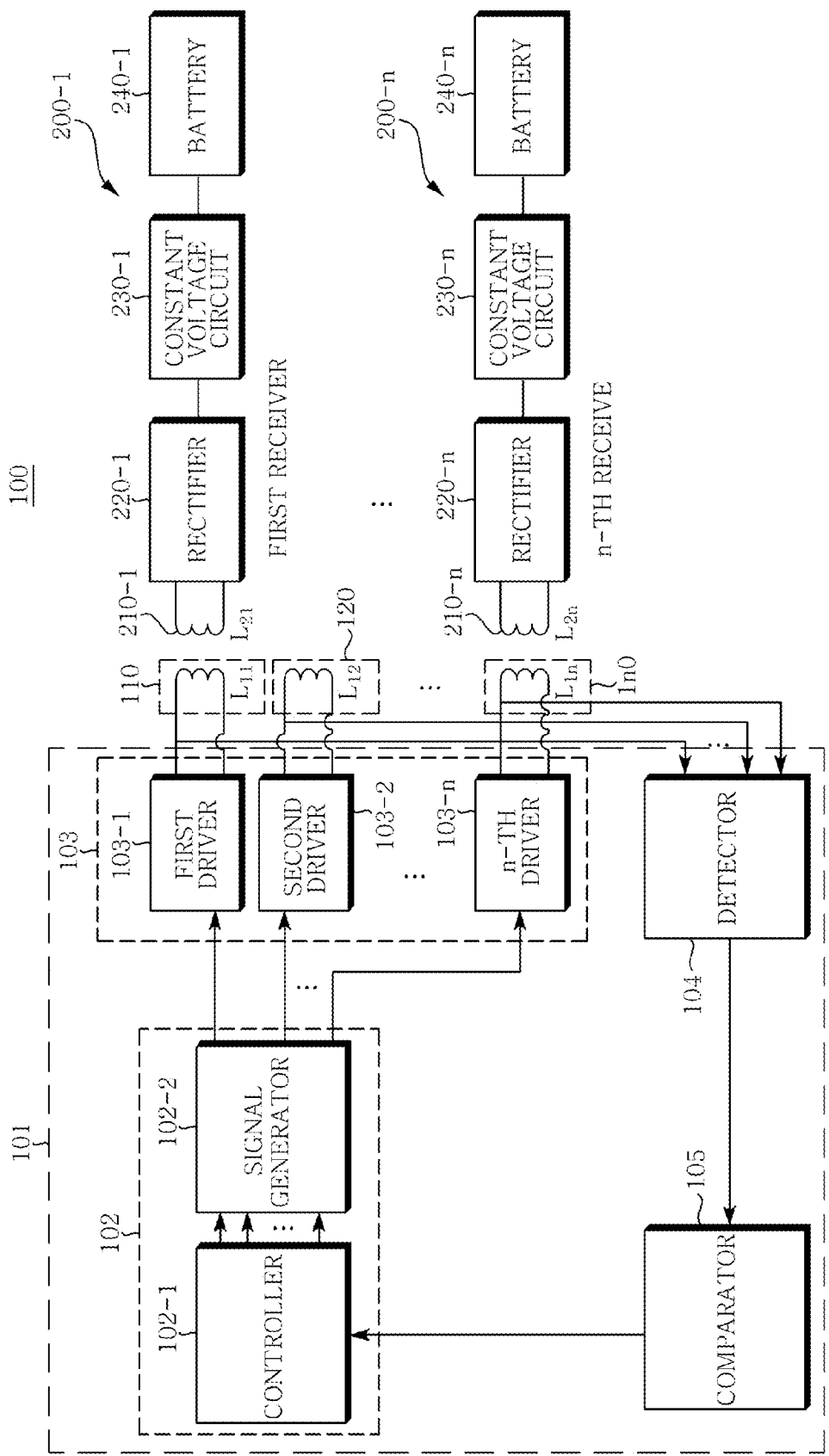
FIG. 18 is a block diagram for illustrating a function of the multi wireless charging apparatus according to the present invention.

Hereinafter, a function of the multi wireless charging apparatus according to the present invention thus manufactured will be described with reference to FIG. 18. FIG. 18 is a block diagram for illustrating a function of the multi wireless charging apparatus according to the present invention.

The multi wireless charging apparatus 100 according to the present invention may be divided into a plurality of wireless charging units 110, 120, . . . , 1n0 including first to fifth wireless charging units 110 to 150, which are shown in FIG. 1, and a control unit 101 controlling the wireless power transmission of the plurality of wireless charging units 110, 120, . . . , 1n0.

In particular, the control unit 101 includes a main controller 102, a plurality of drivers 103 respectively driving the plurality of wireless charging units 110, 120, . . . , 1n0 in response to a control signal of the main controller 102, a detector 104 detecting information about whether a plurality of wireless charging receivers 200-1, . . . , 200-n are positioned correspondingly to the wireless charging units 110, 120, . . . , 1n0, and a comparator 105 comparing currents and voltages detected by the detector 104 with set values to determine whether or not the detected currents and voltages are larger than the set values.

This multi wireless charging apparatus 100 determines from the comparator 105 that the wireless charging receivers 200-1, . . . , 200-n are present if current and voltage detected by the detector 104 are larger than the set values, and wirelessly charging the plurality of wireless charging receivers 200-1, . . . , 200-n positioned correspondingly to the wires charging units 110, 120, . . . , 1n0 at the same time.

In addition, in a case where the multi wireless charging apparatus 100 performs wireless charging while the wireless charging units overlap as shown in FIG. 4 or 5, the multi wireless charging apparatus 100 can perform wireless power transmission without interference by the shielding film 171 provided on the lower surfaces of the wireless charging units 110, 120, . . . , 1n0.

Therefore, the multi wireless charging apparatus according to the present invention can wirelessly charge the plurality of wireless charging receivers at the same time, and allow wireless power transmission without interference through a shielding effect by the shielding film.

In addition, since the multi wireless charging apparatus according to the present invention is slimmed through a thin thickness, and overlapped and combined in various types by using the folding units 161 to 164, it can be conveniently carried about.

As set forth above, the multi wireless charging apparatus according to the present invention can wirelessly charge the plurality of wireless charging receivers at the same time, and allow wireless power transmission without interference through a shielding effect by the shielding film.

Further, since the multi wireless charging apparatus according to the present invention is slimmed through a thin thickness, and overlapped and combined in various types by using the folding units, it can be conveniently carried out.

Although the spirit of the present invention was described in detail with reference to the preferred embodiments, it should be understood that the preferred embodiments are provided to explain, but do not limit the spirit of the present invention.

Also, it is to be understood that various changes and modifications within the technical scope of the present invention are made by a person having ordinary skill in the art to which this invention pertains.

What is claimed is:

1. A multi wireless charging apparatus, comprising:
   a control unit generally controlling a wireless charging procedure;
   a plurality of wireless charging units electrically connected to the control unit, each of the plurality of wireless charging units supported by a rigid base layer; and
   folding units connecting between the wireless charging units, the folding units each having a void therein and being between neighboring wireless charging units, and thereby to be folded up or down.

2. The multi wireless charging apparatus as set forth in claim 1, wherein the wireless charging unit includes a shielding film made of a conductive material and formed on a lower surface thereof, for electromagnetic field shielding.

3. The multi wireless charging apparatus as set forth in claim 2, wherein the conductive material is conductive paste or ferrite.

4. The multi wireless charging apparatus as set forth in claim 1, wherein the folding units each have the void between at least two double-sided FCCLs, and are folded up or down to allow the plurality of wireless charging units to be stacked in a joining type.

5. The multi wireless charging apparatus as set forth in claim 1, wherein the wireless charging unit includes:
   double-sided flexible copper clad laminates (FCCLs) bonded on an upper surface or a lower surface of the rigid base layer by using the rigid base layer therebetween, wherein the double-sided FCCLs each have a circuit layer formed on an upper surface or a lower surface thereof.

6. The multi wireless charging apparatus as set forth in claim 5, wherein the rigid base layer is formed by using a prepreg in which a glass fiber is impregnated with a thermosetting resin.

7. The multi wireless charging apparatus as set forth in claim 5, wherein the circuit layer includes:
   a coil pattern consisting of closed loops;
   a first end disposed inside the coil pattern;
   a first electrode pattern spaced apart from the first end and disposed outside the closed loops of the coil pattern; and
   a wiring pattern electrically connecting the first end and the first electrode pattern through a first conductive via hole H1 and a second conductive via hole H2 passing through the double-sided FCCLs.

8. The multi wireless charging apparatus as set forth in claim 5, wherein the wireless charging unit further includes a cover layer covering an uppermost surface or a lowermost surface of the double-sided FCCLs.

9. The multi wireless charging apparatus as set forth in claim 8, wherein the cover layer is an insulating layer made of a thermosetting material and bonded by using an adhesive.

10. The multi wireless charging apparatus as set forth in claim 8, wherein the cover layer is a solder resist coated and hardened layer.

11. A method for manufacturing a multi wireless charging apparatus, comprising:
   preparing at least two double-sided FCCLs having circuit patterns formed on an upper surface or a lower surface thereof;

compressing the double-sided FCCLs by using rigid base layers therebetween, the rigid base layers being disposed in regions of a plurality of wireless charging units;

forming a wiring pattern electrically connecting the circuit patterns through a first conductive via hole H1 and a second conductive via hole H2 passing through the compressed double-sided FCCLs and the rigid base layer, in a region of the wireless charging unit;

forming cover layers covering external surfaces of the double-sided FCCLs; and mounting component devices on a region of a control unit electrically connected to the wireless charging units, wherein the plurality of wireless charging units are supported by the rigid base layer, and neighboring wireless charging units are folded up or down based on a void formed in a folding unit between wireless charging units.

12. The method as set forth in claim 11, wherein in the preparing of the double-sided FCCLs, the circuit patterns include:

coil patterns each consisting of closed loops;

first ends disposed inside the coil patterns; and first electrode patterns spaced apart from the first ends and disposed outside the closed loops of the coil patterns.

13. The method as set forth in claim 12, wherein in the forming of the wiring pattern, the wiring pattern electrically connects the first ends and the first electrode patterns through the first conductive via hole H1 and the second conductive via hole H2.

14. The method as set forth in claim 11, wherein the compressing of the double-sided FCCLs includes:

forming the plurality of rigid base layers made of a prepreg in which a glass fiber is impregnated with a thermosetting resin;

disposing the rigid base layers in the regions of the wireless charging units such that the rigid base layers are spaced apart from each other at a distance corresponding to a region of each folding unit; and heat-compressing the double-sided FCCLs by using the rigid base layers therebetween.

15. The method as set forth in claim 11, wherein the forming of the cover layers includes:

bonding an insulating layer made of a thermosetting material by using an adhesive on the external surfaces of the double-sided FCCLs; and providing shielding films made of a conductive material and formed on an external surface of the insulating layer, in the regions of the wireless charging units, for electromagnetic field shielding.

16. The method as set forth in claim 15, wherein the conductive material is conductive paste or ferrite.

17. The method as set forth in claim 11, wherein the forming of the cover layers includes:

forming a solder resist layer by coating and hardening solder resist on the external surfaces of the double-sided FCCLs; and providing shielding films made of a conductive material and formed on an external surface of the solder resist layer, in the regions of the wireless charging units, for electromagnetic field shielding.

18. The method as set forth in claim 17, wherein the conductive material is conductive paste or ferrite.

* * * * *